US007461614B2

(12) United States Patent
Fink et al.

(10) Patent No.: US 7,461,614 B2
(45) Date of Patent: Dec. 9, 2008

(54) METHOD AND APPARATUS FOR IMPROVED BAFFLE PLATE

(75) Inventors: Steven T Fink, Mesa, AZ (US); Eric J Strang, Chandler, AZ (US); Arthur H Laflamme, Jr., Rowley, MA (US); Jay Wallace, Danvers, MA (US); Sandra Hyland, Falls Church, VA (US)

(73) Assignee: Tokyo Electron Limited (JP)

( * ) Notice: Subject to any disclaimer, the term of this patent is extended or adjusted under 35 U.S.C. 154(b) by 614 days.

(21) Appl. No.: 10/705,224

(22) Filed: Nov. 12, 2003

(65) Prior Publication Data

US 2005/0098265 A1    May 12, 2005

(51) Int. Cl.
*C23C 4/10* (2006.01)
*H01L 21/205* (2006.01)

(52) U.S. Cl. ............................. 118/723 E; 118/723 ER; 156/345.51

(58) Field of Classification Search ............... 118/723 E, 118/723 R, 723 ER; 156/345.51
See application file for complete search history.

(56) References Cited

U.S. PATENT DOCUMENTS

| 5,900,103 | A | | 5/1999 | Tomoyasu et al. | |
|---|---|---|---|---|---|
| 5,919,332 | A | | 7/1999 | Koshiishi et al. | |
| 6,063,441 | A | * | 5/2000 | Koai et al. | 427/248.1 |
| 6,129,044 | A | * | 10/2000 | Zhao et al. | 118/715 |
| 6,156,151 | A | * | 12/2000 | Komino et al. | 156/345.29 |
| 6,264,788 | B1 | * | 7/2001 | Tomoyasu et al. | 156/345.43 |
| 6,464,843 | B1 | * | 10/2002 | Wicker et al. | 204/192.15 |
| 6,506,685 | B2 | * | 1/2003 | Li et al. | 438/710 |
| 6,646,233 | B2 | * | 11/2003 | Kanno et al. | 219/390 |
| 6,676,803 | B2 | * | 1/2004 | Kim | 156/345.47 |
| 6,733,620 | B1 | * | 5/2004 | Sugiyama et al. | 156/345.29 |
| 6,805,135 | B1 | * | 10/2004 | Hirota et al. | 134/2 |
| 6,837,966 | B2 | * | 1/2005 | Nishimoto et al. | 156/345.29 |
| 6,894,769 | B2 | * | 5/2005 | Ludviksson et al. | 356/72 |
| 2005/0041238 | A1 | * | 2/2005 | Ludviksson et al. | 356/72 |

FOREIGN PATENT DOCUMENTS

| EP | 1 069 603 A | 1/2001 |
|---|---|---|
| JP | 2002-252209 | 9/2002 |
| JP | 2003-166043 | 6/2003 |

OTHER PUBLICATIONS

English Translation of JP2002-252209 from www4.ipdl.ncipi.go.jp.*
English Translation of JP2002-252209 from www4.ipdl.ncipi.go.jp, published Sep. 6, 2002.*

* cited by examiner

*Primary Examiner*—Sylvia R MacArthur

(57) ABSTRACT

A baffle plate assembly, configured to be coupled to a substrate holder in a plasma processing system, comprises a baffle plate having one or more openings to permit the passage of gas there through, wherein the coupling of the baffle plate to the substrate holder facilitates auto-centering of the baffle plate in the plasma processing system. For example, a centering ring mounted in the substrate holder can comprise a centering feature configured to couple with a mating feature on the baffle plate. After initial assembly of the plasma processing system, the baffle plate can be replaced and centered within the plasma processing system without disassembly and re-assembly of the substrate holder.

11 Claims, 16 Drawing Sheets

METHOD AND APPARATUS FOR IMPROVED BAFFLE PLATE

FIELD OF THE INVENTION

The present invention relates to a method and apparatus for utilizing a baffle plate in a plasma processing system and, more particularly, to a baffle plate assembly that facilitates improved assembly of the plasma processing system.

BACKGROUND OF THE INVENTION

The fabrication of integrated circuits (IC) in the semiconductor industry typically employs plasma to create and assist surface chemistry within a vacuum processing system necessary to remove material from and deposit material to a substrate. In general, plasma is formed within the processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the system (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the processing system can lead to a gradual degradation of the plasma processing performance and ultimately to complete failure of the system.

In order to minimize the damage sustained by exposure to the processing plasma, a consumable or replaceable component, such as one fabricated from silicon, quartz, alumina, carbon, or silicon carbide, can be inserted within the processing chamber to protect the surfaces of more valuable components that would impose greater costs during frequent replacement and/or to affect changes in the process. Furthermore, it is desirable to select surface materials that minimize the introduction of unwanted contaminants, impurities, etc. to the processing plasma and possibly to the devices formed on the substrate. Often times, these consumables or replaceable components are considered part of the process kit, which is frequently maintained during system cleaning.

SUMMARY OF THE INVENTION

A method and apparatus for utilizing a baffle plate in a plasma processing system is described.

According to one aspect, a baffle plate assembly for surrounding a substrate holder in a plasma processing system comprises a centering ring configured to be coupled to the substrate holder and a baffle plate comprising one or more passageways, wherein the baffle plate is configured to be centered within the plasma processing system by coupling the baffle plate to the centering ring.

According to another aspect, a disposable baffle plate for surrounding a substrate holder in a plasma processing system comprises a ring comprising a first edge configured to be coupled to the substrate holder, a second edge configured to be proximate a wall of the plasma processing system, and one or more passageways to permit the passage of gas there through, wherein the coupling of the first edge to the substrate holder facilitates centering the ring in the plasma processing system such that a space between the second edge and the wall is substantially constant.

Additionally, a method of replacing a baffle plate surrounding a substrate holder in a plasma processing system comprises removing a first baffle plate from the plasma processing system and installing a second baffle plate in the plasma processing system by coupling the second baffle plate to the substrate holder, wherein the coupling facilitates auto-centering of the second baffle plate in the plasma processing system.

DETAILED DESCRIPTION OF SEVERAL EMBODIMENTS

In plasma processing, a baffle plate can be employed to aid in confining the plasma to the processing region adjacent the substrate, as well as to affect the uniformity of fluid mechanic properties in the processing region adjacent the substrate. For conventional plasma processing systems, the baffle plate is configured to surround the substrate holder and, in many cases, the baffle plate is physically coupled to the substrate holder using fasteners. In general, the baffle plate comprises a plurality of openings to permit the passage of process gases, reactants and reaction products to the vacuum pumping system.

Figure 1:
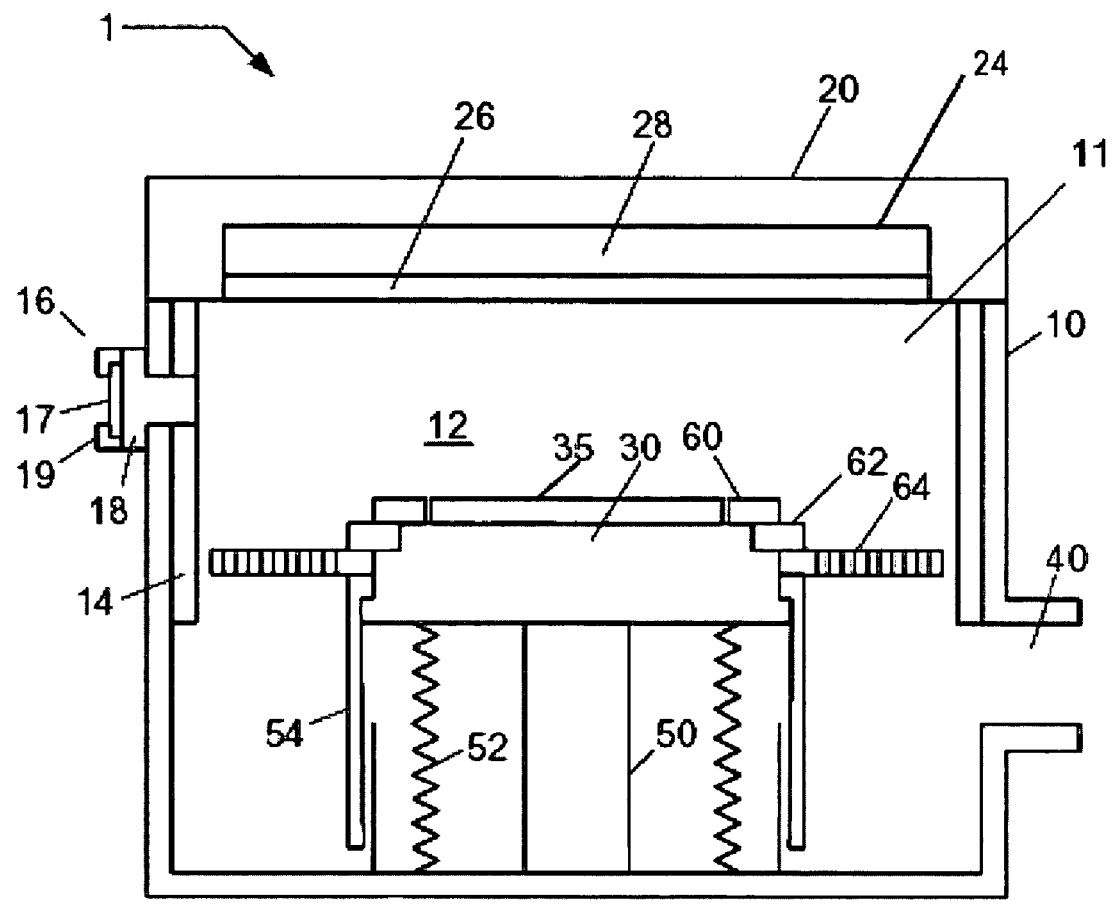
FIG. 1 illustrates a schematic block diagram of a plasma processing system according to an embodiment of the present invention.

According to an embodiment of the present invention, a plasma processing system 1 is depicted in FIG. 1 comprising a plasma processing chamber 10, an upper assembly 20, an electrode plate assembly 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in process space 12 adjacent substrate 35. The plasma processing system 1 can be configured to process substrates of any size, such as 200 mm substrates, 300 mm substrates, or larger.

In the illustrated embodiment, electrode plate assembly 24 comprises an electrode plate 26 (FIG. 1) and an electrode 28 (FIG. 1). In an alternate embodiment, upper assembly 20 can comprise at least one of a cover, a gas injection assembly, and an upper electrode impedance match network. The electrode plate assembly 24 can be coupled to an RF source. In another alternate embodiment, the upper assembly 20 comprises a cover coupled to the electrode plate assembly 24, wherein the electrode plate assembly 24 is maintained at an electrical potential equivalent to that of the plasma processing chamber 10. For example, the plasma processing chamber 10, the upper assembly 20, and the electrode plate assembly 24 can be electrically connected to ground potential.

Plasma processing chamber 10 can further comprise an optical viewport 16 coupled to a deposition shield 14. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can permit monitoring of optical emission from the processing plasma in process space 12.

Substrate holder 30 can further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can be coupled to the substrate holder 30 and configured to protect the bellows 52 from the processing plasma. Substrate holder 10 can further be coupled to at least one of a focus ring 60, and a shield ring 62. Furthermore, a baffle plate 64 can extend about a periphery of the substrate holder 30.

Substrate 35 can be transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be affixed to the substrate holder 30 via an electrostatic clamping system. Furthermore, substrate holder 30 can further include a cooling system including a re-circulating coolant flow that receives heat from substrate holder 30 and transfers heat to a heat exchanger system (not shown), or when heating, transfers heat from the heat exchanger system. Moreover, gas can be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from approximately 1 MHz to approximately 100 MHz or approximately 13.56 MHz. RF systems for plasma processing are well known to those skilled in the art.

Alternately, the processing plasma in process space 12 can be formed using a parallel-plate, capacitively coupled plasma (CCP) source, an inductively coupled plasma (ICP) source, any combination thereof, and with and without magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2A:
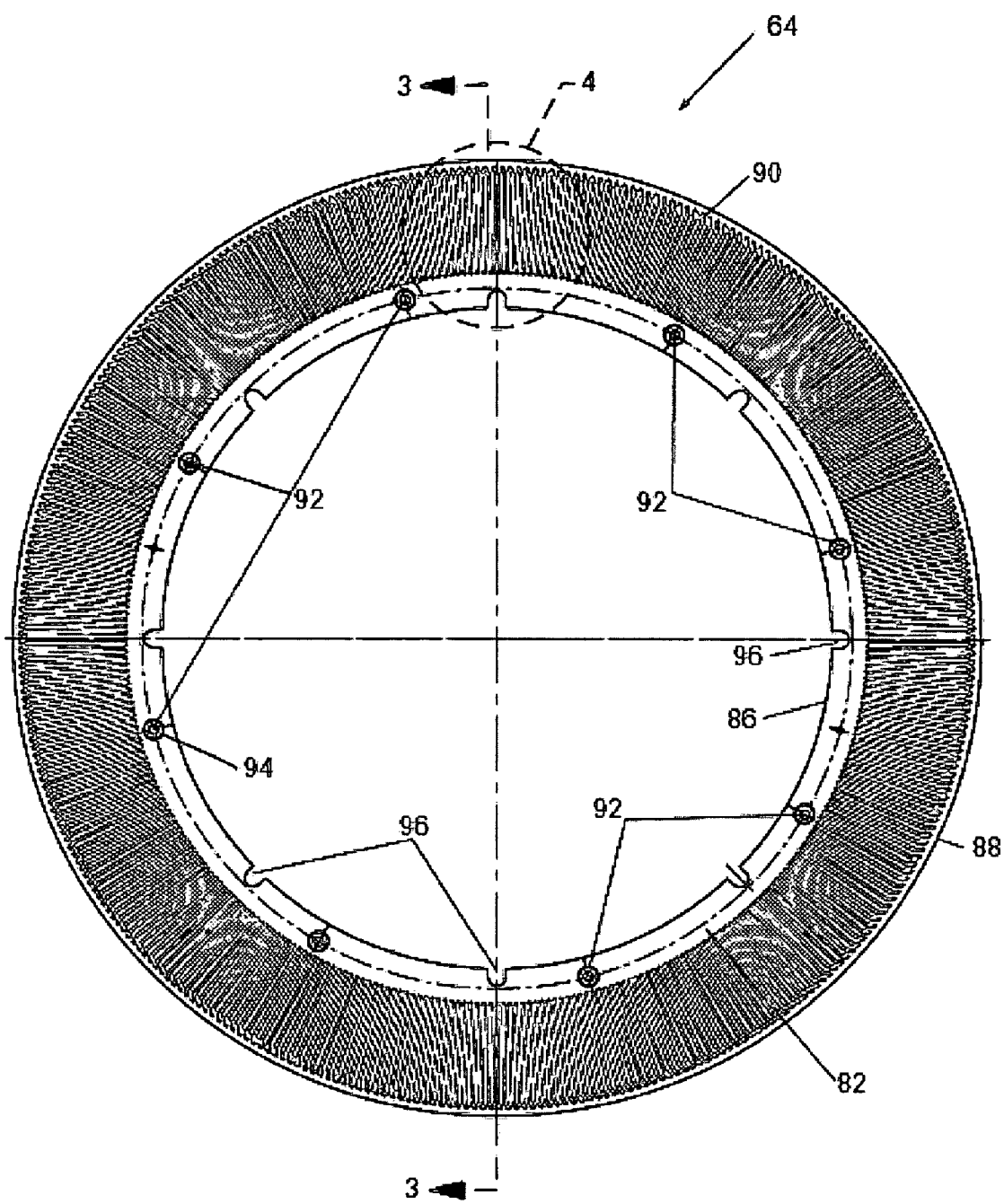
FIG. 2A presents a top plan view of a baffle plate according to an embodiment of the present invention.
Figure 2B:
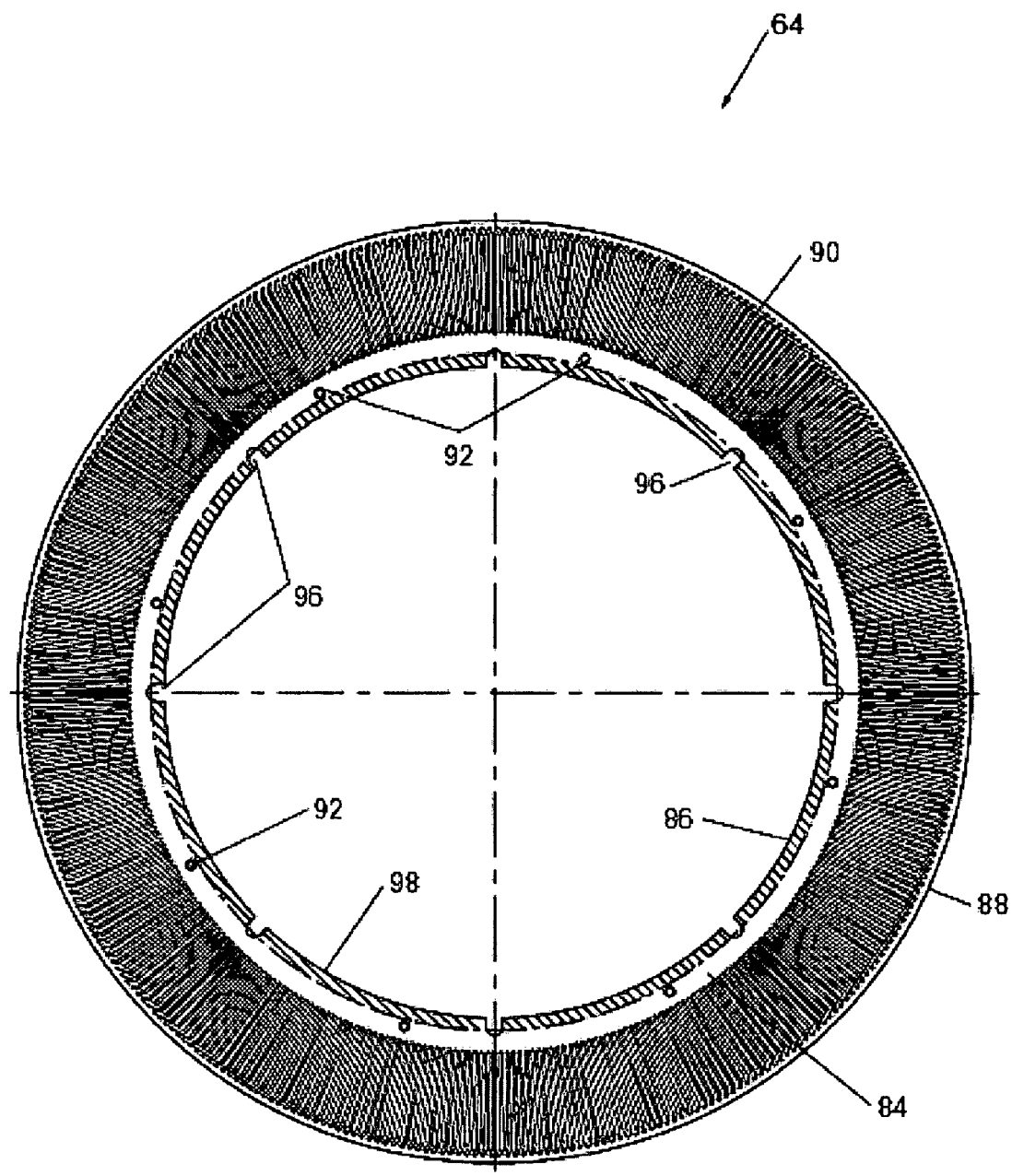
FIG. 2B presents a bottom plan view of the baffle plate depicted in FIG. 2A.
Figure 3:
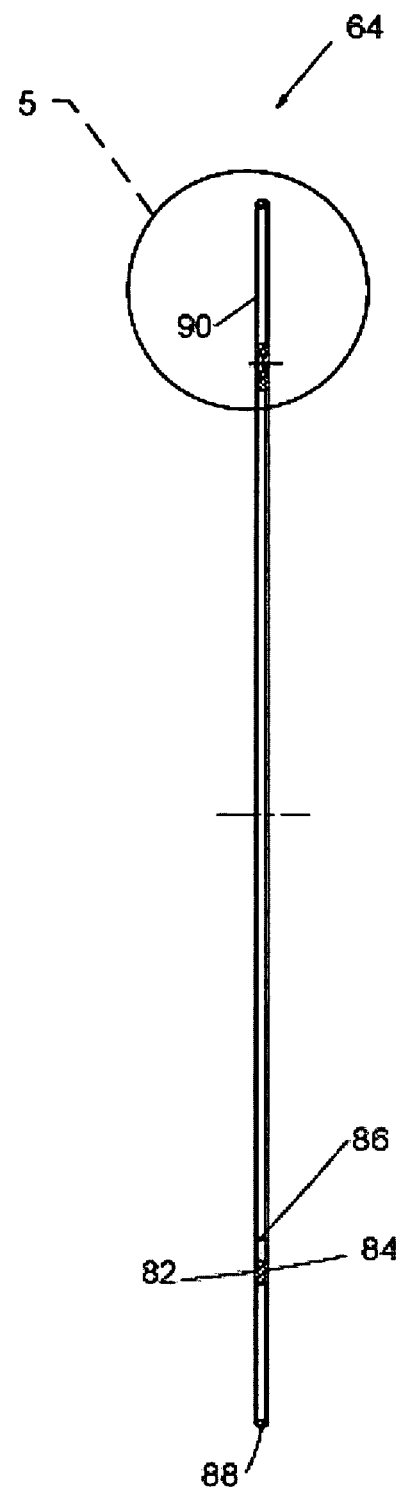
FIG. 3 presents cross-sectional view of the baffle plate depicted in FIGS. 2A and 2B.

Referring now to an illustrated embodiment of the present invention depicted in FIG. 2A (top plan view), FIG. 2B (bottom plan view), and FIG. 3 (cross sectional view), baffle plate 64 can form a ring comprising an upper surface 82, a lower surface 84, an inner radial edge 86, and an outer radial edge 88. The baffle plate 64 can further comprise at least one passageway 90 between the upper surface 82 and to the lower surface 84, and configured to permit the flow of gas therethrough.

Figure 4:
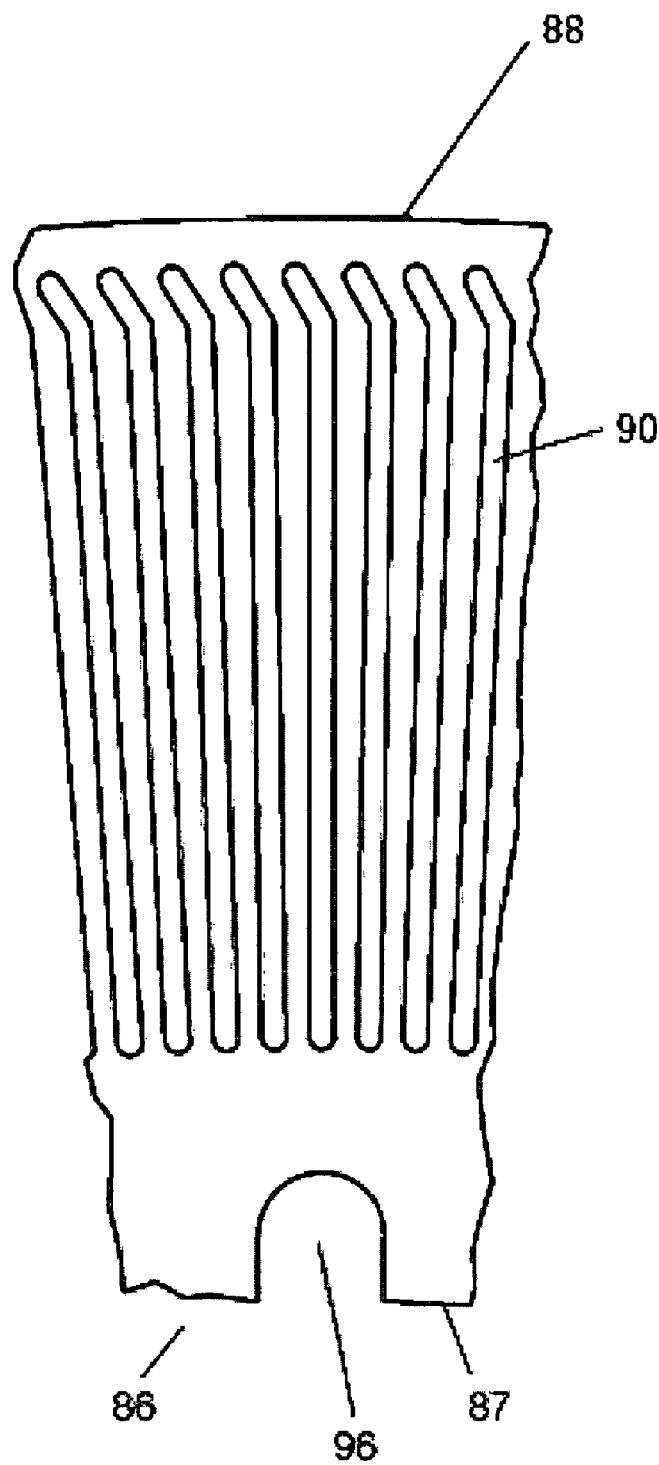
FIG. 4 presents an expanded plan view of the baffle plate depicted in FIGS. 2A and 2B.
Figure 5:
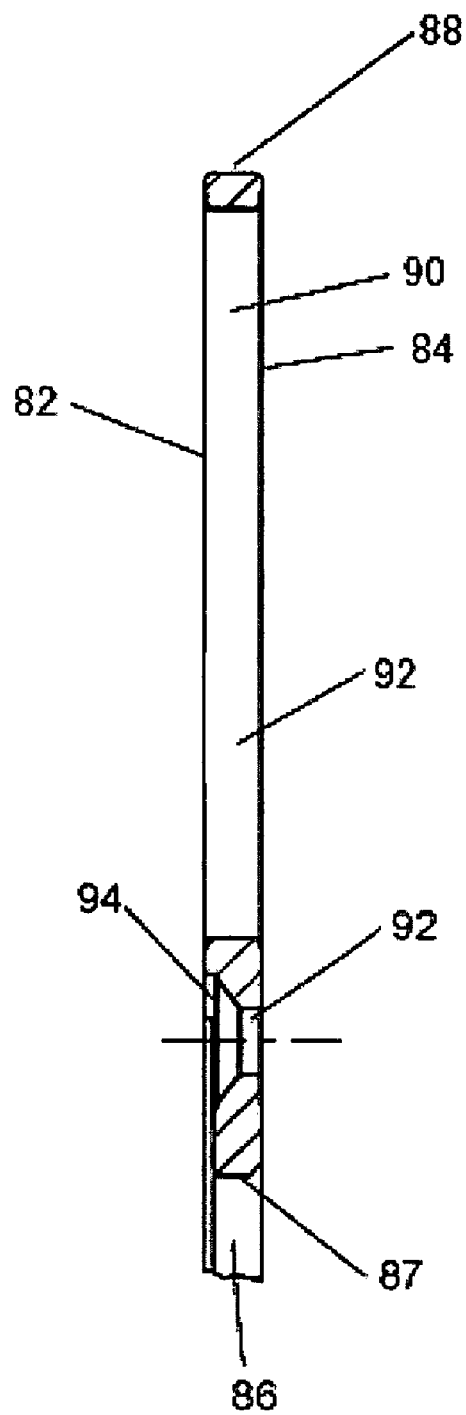
FIG. 5 presents an expanded cross-sectional view of the baffle plate depicted in FIGS. 2A and 2B.

FIG. 4 provides an expanded plan view of several passageways 90 and FIG. 5 provides an expanded cross-sectional view of one of the passageways 90, wherein the expanded cross-sectional view provides a transverse cross sectional view taken along a minor axis of the passageway 90. Each passageway 90 comprises an inner passageway surface 92 contiguous with the upper surface 82 and the lower surface 84 of the baffle plate 64. For example, at least one passageway 90 can comprise a length, dictated by the distance between the upper surface 82 and the lower surface 84 proximate each passageway 90, having a dimensional range from approximately 1 to approximately 50 mm. Alternatively, the length can range from approximately 1 to approximately 10 mm, or the length can be approximately 3 mm. The passageway can, for example, be fabricated using at least one of machining, laser-cutting, grinding, polishing, and forging.

In the illustrated embodiment shown in FIG. 4 and FIG. 5, the at least one passageway 90 can comprise slots aligned in a radial direction. For example, as shown in FIGS. 2A, 2B, and 4, the slots can be spaced azimuthally every degree. In an alternate embodiment of the present invention, the slots can be aligned in an azimuthal direction. In an alternate embodiment of the present invention, the slots can be slanted and, therefore, aligned partially in a radial direction and an azimuthal direction. In an alternate embodiment, the passageways 90 can comprise a combination of alignment methodologies thereof. Alternately, the passageways can include at least one orifice. Alternately, the passageways comprise a plurality of orifices having a constant size and uniform distribution on the baffle plate 64. Alternately, the passageways comprise a plurality of orifices, wherein at least one of the orifice size, distribution (or number density), and orifice shape varies across the baffle plate 64. For example, when a vacuum pump (not shown) accesses a processing chamber 10 through a pumping duct 40, as shown in FIG. 1, the number of passageways, or the size of the passageways can be reduced local to the entrance to the pumping duct 40 in order to correct for the non-uniform pressure field inherent to such an arrangement.

Additionally, referring still to FIG. 4, the cross sectional area can be, for example, constant along the length of the passageway from the upper surface 82 to the lower surface 84. Alternately, the cross-sectional exit area of the passageway 90 at the lower surface 84 can, for example, comprise a cross-sectional area greater than the respective cross-sectional entrance area of the passageway 90 at the upper surface 82. Alternately, the cross-sectional exit area of the passageway 90 at the lower surface 84 can, for example, comprise a cross-sectional area lesser than the respective cross-sectional entrance area of the passageway 90 at the upper surface 82.

Figure 6:
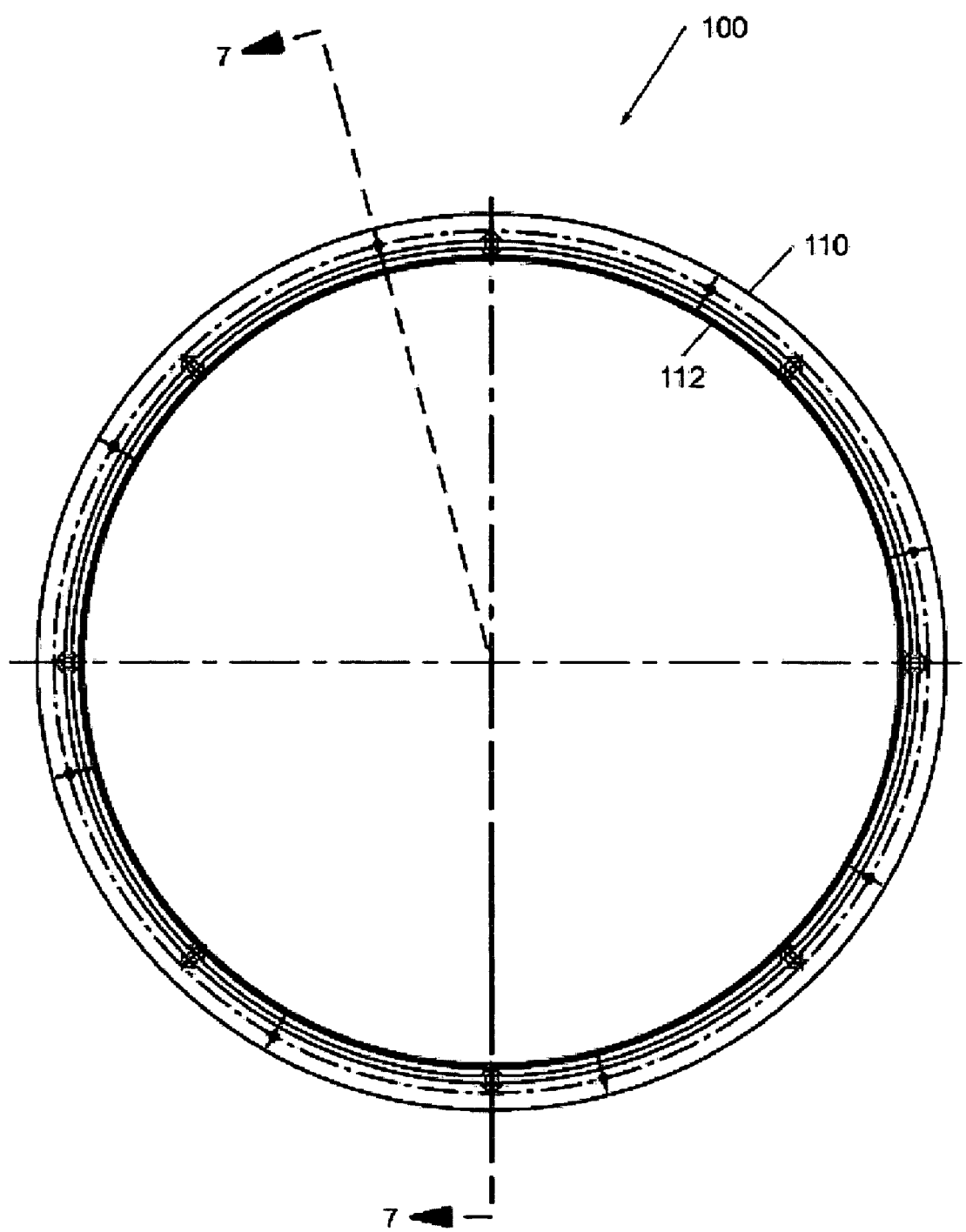
FIG. 6 presents a plan view of a centering ring according to an embodiment of the present invention.
Figure 7:
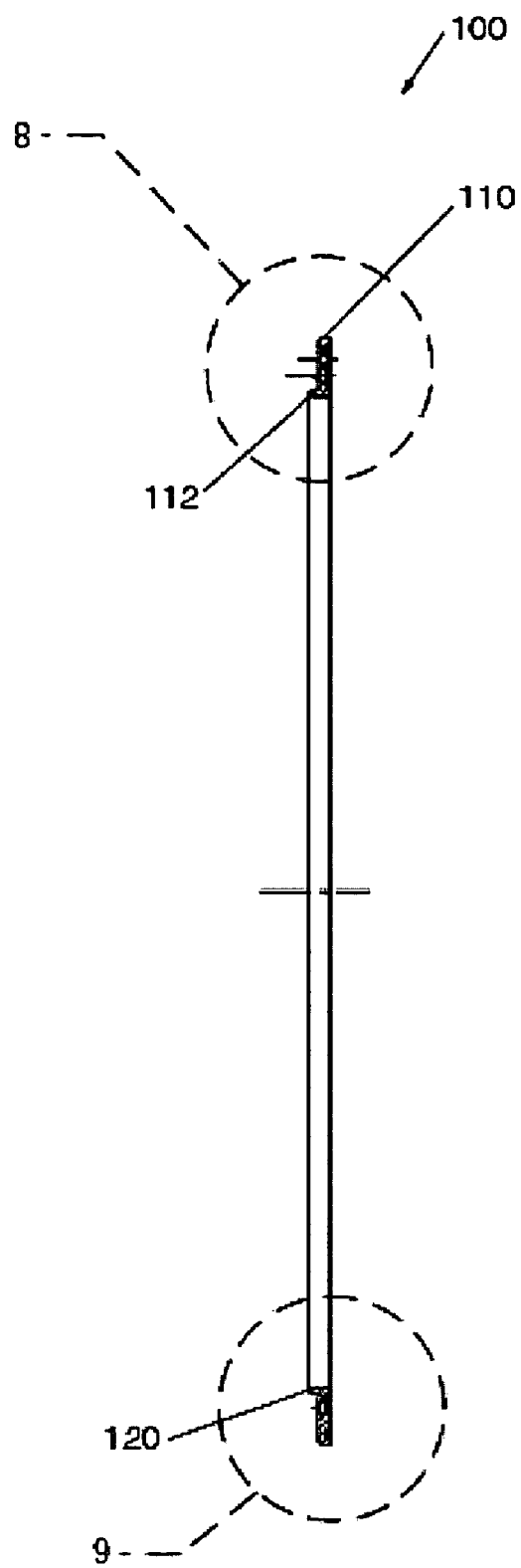
FIG. 7 presents a cross-sectional view of the centering ring depicted in FIG. 6.

According to an embodiment of the present invention, baffle plate 62 can be automatically centered on a substrate holder by coupling a mating feature on the baffle plate with a centering feature on the substrate holder. For example, the mating feature on baffle plate 64 comprises a mating surface 87 on the inner radial edge 86 (see FIG. 5). Additionally, the centering feature on the substrate holder can comprise a centering ring affixed to the substrate holder. FIG. 6 presents a plan view of a centering ring 100, and FIG. 7 presents a cross-sectional view of the centering ring 100. The centering ring 100 can comprise a flange region 110, and a lip region 112, wherein the lip region 112 further comprises a centering surface 120. The centering surface 120 can, for example, comprise a radial surface as shown in FIGS. 6 and 7, wherein a radial locational clearance fit is provided between the mating surface 87 and the centering surface 120 upon coupling of the baffle plate 64 to the centering ring 100.

Figure 8:
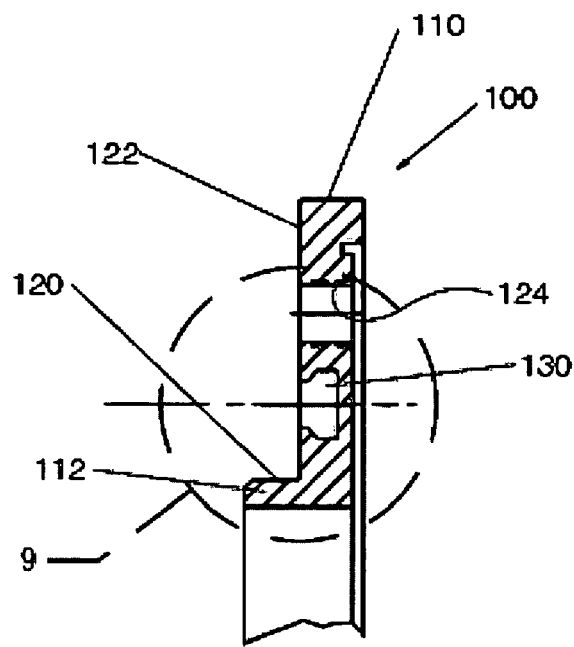
FIG. 8 presents an expanded cross-sectional view of the centering ring depicted in FIG. 6.

Once the baffle plate 64 is coupled to the centering ring 100, the lower surface 84 of baffle plate 64 can rest atop a receiving surface 122 on the flange region 110 of the centering ring 100. Alternately, the baffle plate 64 can be affixed to the centering ring 100 using fasteners (such as bolts) in order to assert mechanical pressure therebetween. For example, baffle plate 64, as shown in FIGS. 2A and 2B, and FIG. 3, comprises one or more through-holes 92, each having a counterbore 94, through which a fastener (not shown), such as a bolt, may extend, wherein each counterbore 94 facilitates capturing the head of the fastener. Additionally, for example, centering ring 100, as shown in FIG. 8, comprises a tapped hole 124, wherein the tapped hole 124 captures a threaded end of the fastener. Upon fastening the baffle plate 64 to the centering ring 100, the mechanical pressure asserted by, for instance, the action of torque on the threaded fastener, can improve the thermal contact between the baffle plate 64 and the centering ring 100.

Figure 9:
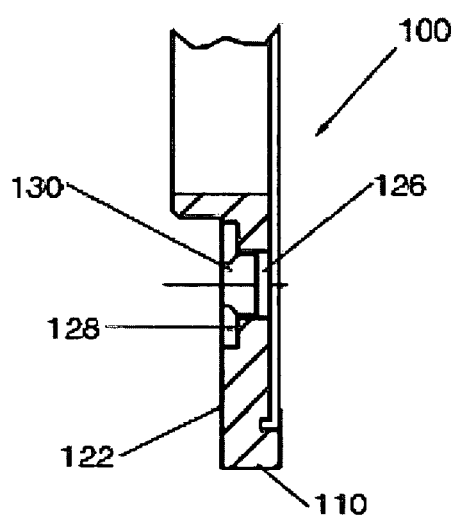
FIG. 9 presents another expanded cross-sectional view of the centering ring depicted in FIG. 6.

Additionally, as shown in FIG. 9, centering ring 100 comprise one or more fastening through-holes 126, each having a fastening counterbore 128, through which a fastener (not shown), such as a bolt, may extend, wherein each fastening counterbore 128 facilitates capturing the head of the fastener. Additionally, for example, in order to fasten the baffle plate 64 to the centering ring 100, the baffle plate 64 can further comprise one or more clearance relief 96 that are configured to provide clearance for the one or more fasteners employed to couple the centering ring 100 to the substrate holder. The use of fasteners and one or more fastening through-holes 126 can facilitate affixing the centering ring 100 to the substrate holder.

Figure 10:
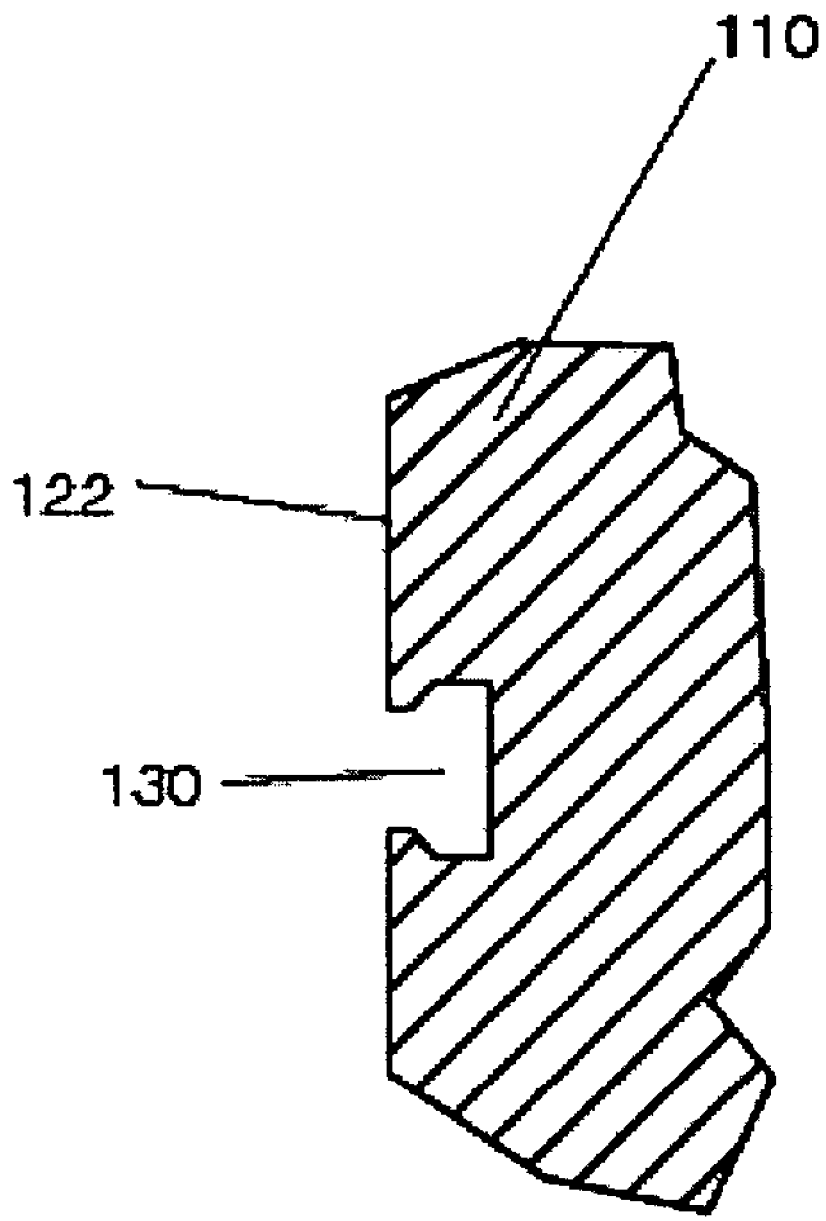
FIG. 10 presents another expanded cross-sectional view of the centering ring depicted in FIG. 6.
Figure 11:
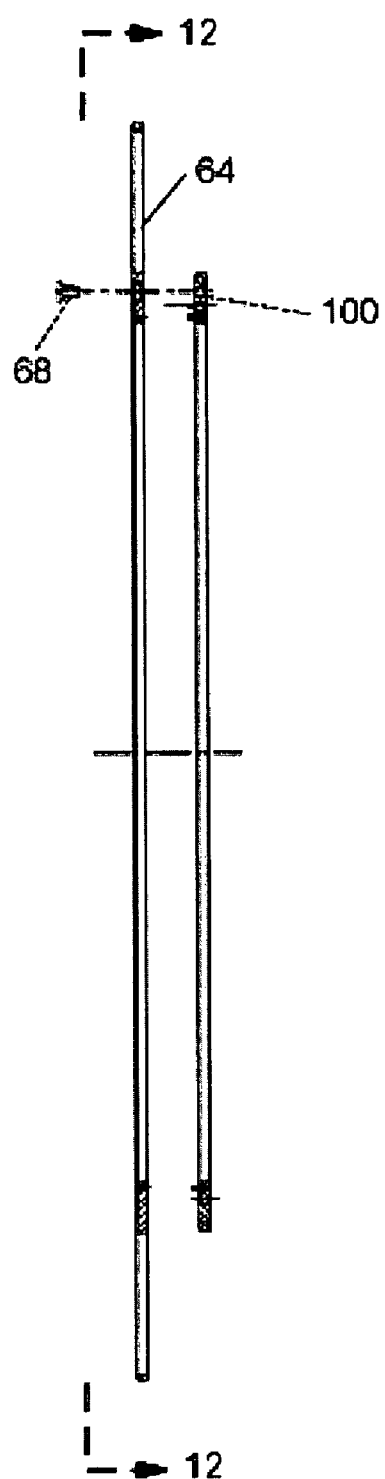
FIG. 11 presents a cross-sectional view of a baffle plate and a centering ring according to another embodiment of the present invention.

Also, centering ring 100 can further comprise an electrical contact feature, wherein the electrical contact feature, for example, comprises a groove 130 (see FIGS. 8, 9 and 10) configured to receive a deformable electrical contact device such as Spirashield™. When the baffle plate 64 is mechanically fastened to the centering ring 100 and the centering ring 100 is mechanically fastened to the substrate holder, the Spirashield™ (having an inner elastomeric core surrounded by a helical metal shield) is compressed within groove 130, hence, improving the electrical contact between the baffle plate 64 and centering ring 100.

Furthermore, a protective barrier can be formed on any surface of the baffle plate 64, and the centering ring 100. The protective barrier can, for instance, facilitate the provision of an erosion resistant surface when the baffle plate is exposed to harsh processing environments, such as plasma. During fabrication, the protective barrier can comprise at least one of providing a surface anodization on one or more surfaces, providing a spray coating on one or more surfaces, or subjecting one or more surfaces to plasma electrolytic oxidation. The protective barrier can comprise a layer of at least one of a III-column element and a Lanthanon element. The protective barrier can comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. Methods of anodizing aluminum components and applying spray coatings are well known to those skilled in the art of surface material treatment.

All surfaces on baffle plate 64 can be provided the protective barrier, applied using any of the techniques described above. In another example, all surfaces on baffle plate 64, except for a contact region 98 on lower surface 84 as shown in FIG. 2B (cross-hatched region) can be provided the protective barrier, applied using any of the techniques described above. Prior to the application of the protective barrier to the surfaces of the baffle plate, the contact region 98 can be masked in order to prevent the formation of the barrier layer thereon. Alternatively, following the application of the protective barrier to the surfaces of the baffle plate, the contact region 98 can be machined to remove the barrier layer formed thereon.

Centering of the baffle plate 64 with respect to the centering ring 100 is alternately accomplished as shown in FIGS. 11, 12, 13A, and 13B. A dowel pin 101 and a mating pin-hole 102, along with a diamond pin 103 and another mating pin-hole 104 provide features for centering the baffle plate 64 to the centering ring 100 as the parts are coupled using threaded hardware 68. This arrangement is commonly used for centering, and is easily understood by anyone skilled in the art of aligning two or more components.

Figure 12:
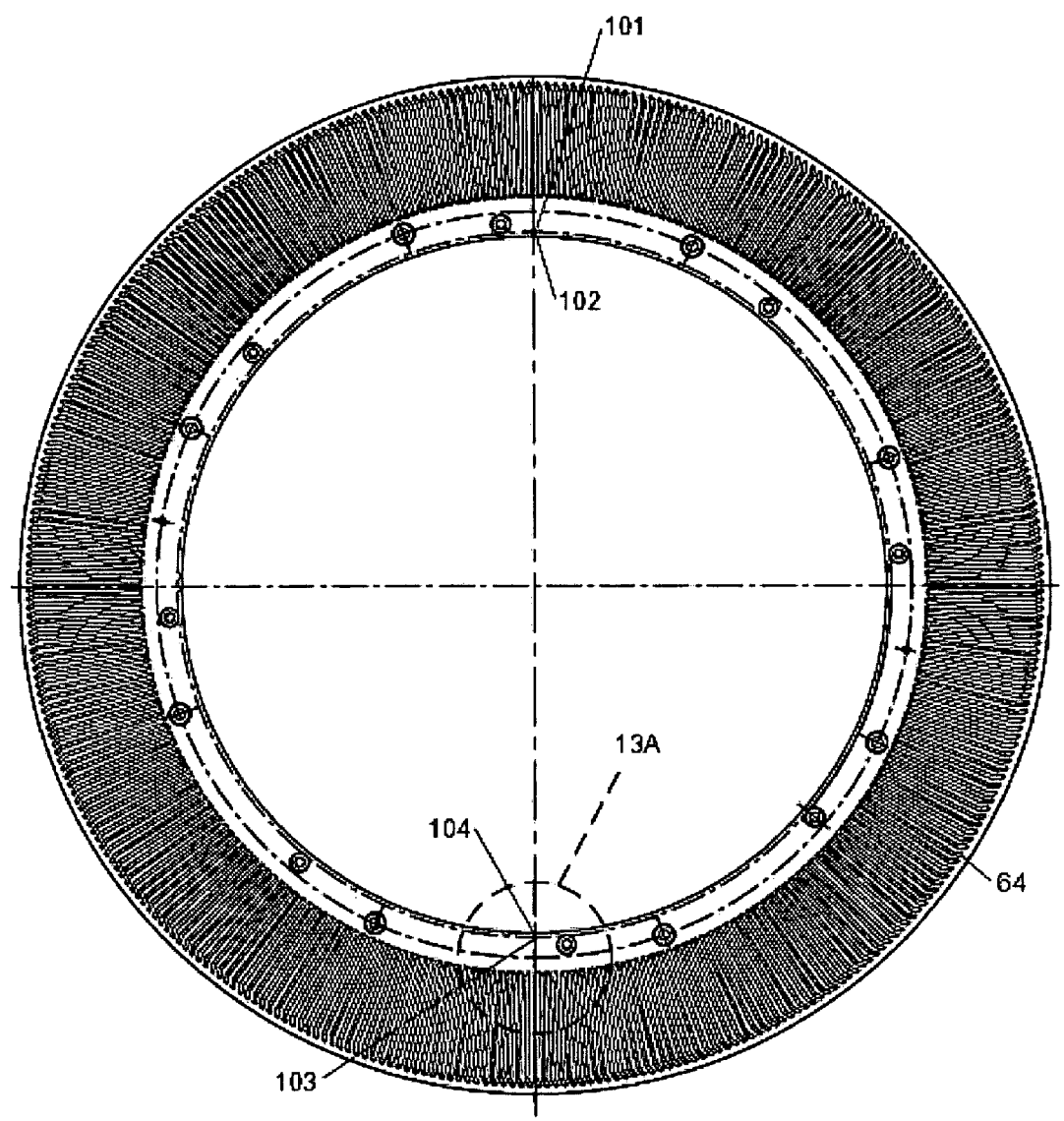
FIG. 12 presents a plan view of the baffle plate depicted in FIG. 11.
Figure 13B:
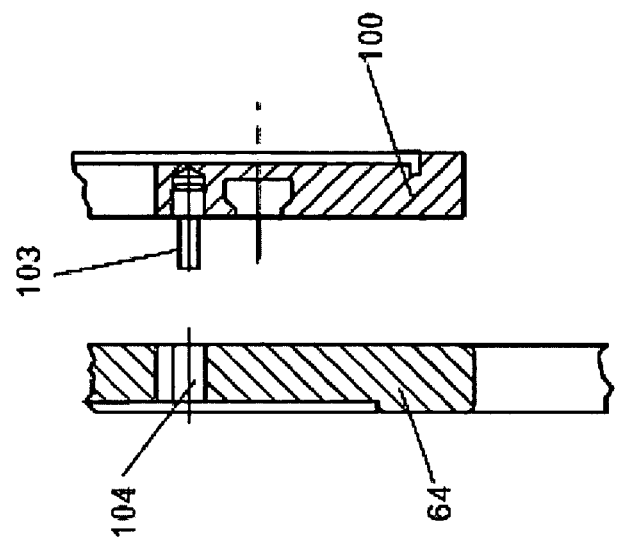
FIGS. 13A and 13B show an expanded plan view and an expanded cross-sectional view of a structure which centers the baffle plate and centering ring depicted in FIG. 11.
Figure 13A:
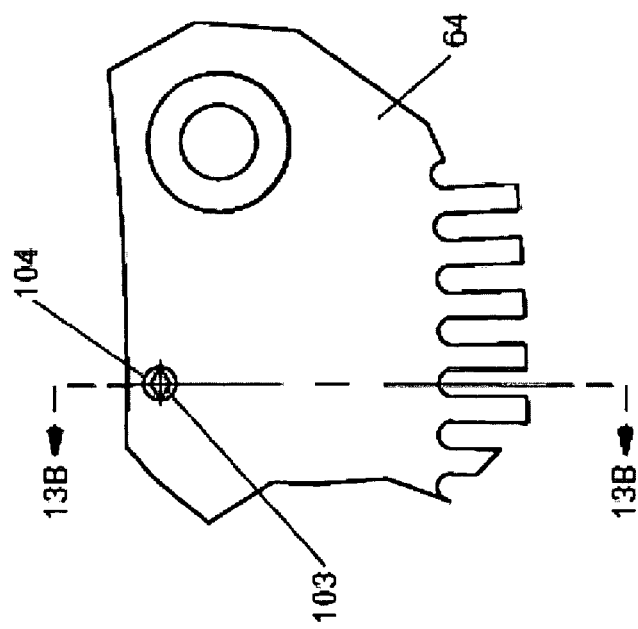
Figure 13D:
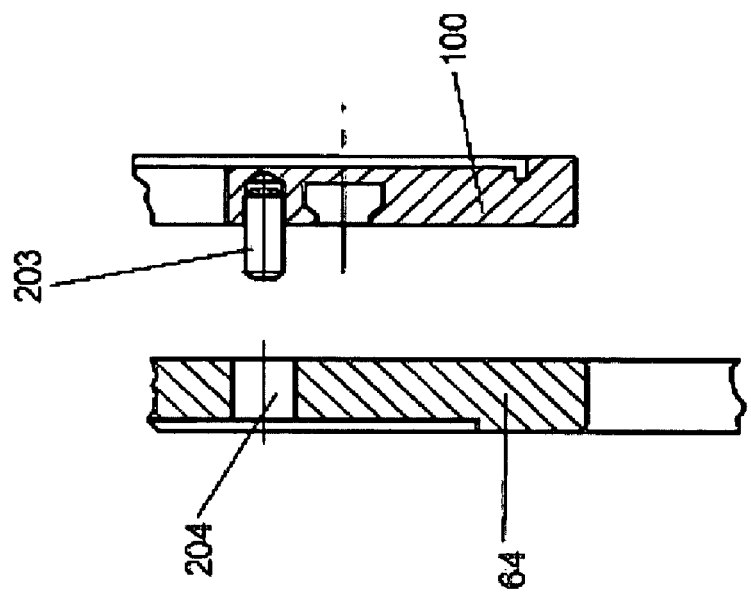
FIGS. 13C and 13D show an expanded plan view and an expanded cross-sectional view of another structure which centers the baffle plate and centering ring depicted in FIG. 11.
Figure 13C:
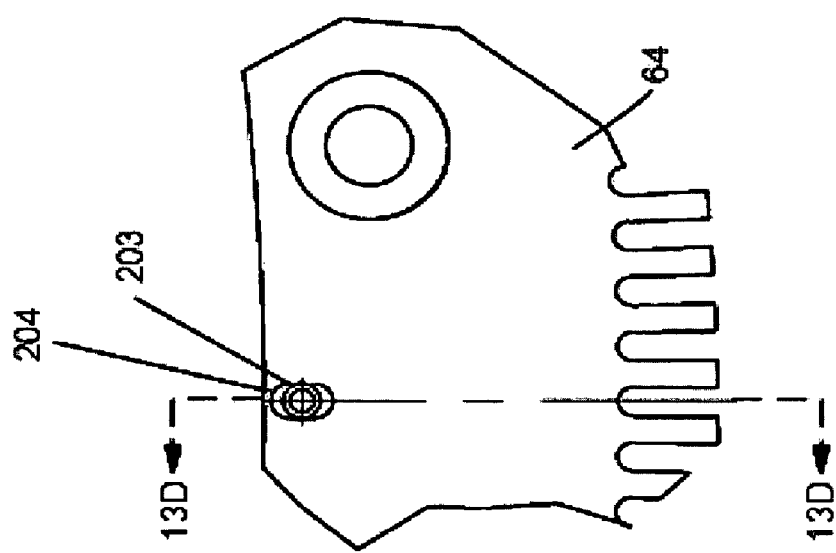

Another alternate centering embodiment is accomplished as shown in FIGS. 11, 12, 13C, and 13D. FIGS. 13C and 13D show an alternative to FIGS. 13A and 13B and the portion of FIG. 12 shown in FIG. 13A. A dowel pin 101 and a mating pin-hole 102 (in FIG. 12) along with another pin 203 and a mating slot feature 204 (in FIGS. 13C and 13D) provide features for centering the baffle plate 64 to the centering in as the parts are coupled using threaded hardware 68. This arrangement is also commonly utilized and is easily understood by anyone skilled in the art of aligning two or more components.

Figure 13E:
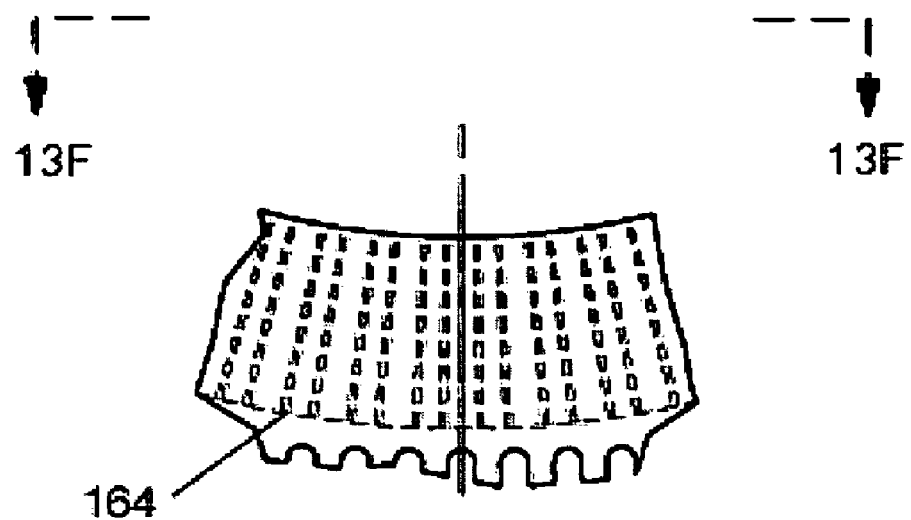
FIGS. 13E and 13F show an expanded plan view and an expanded cross-sectional view of another structure which centers the baffle plate and centering ring depicted in FIG. 11.
Figure 13F:
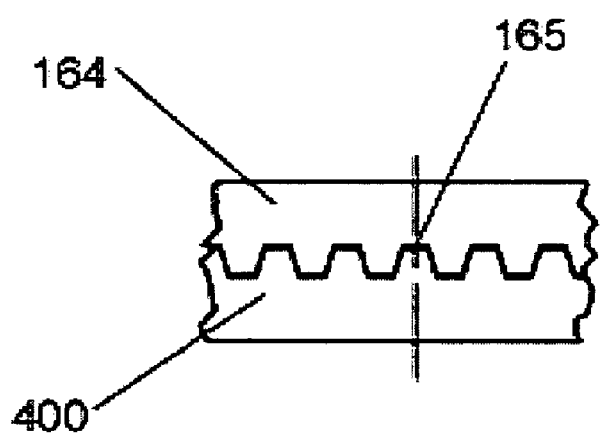

Another alternate centering embodiment is accomplished as shown in FIGS. 11, 12, 13E, and 13F. FIGS. 13E and 13F show an alternative to FIGS. 13A and 13B and the portion of FIG. 12 shown in FIG. 13A. Centering of baffle plate 164 and centering ring 400 is accomplished through the use of radial face gear teeth 165. The teeth mesh as the baffle plate 164 and centering plate 400 are coupled and secured using threaded hardware 68. This arrangement of centering features is also easily understood by anyone skilled in the art of aligning two or more components.

Figure 14:
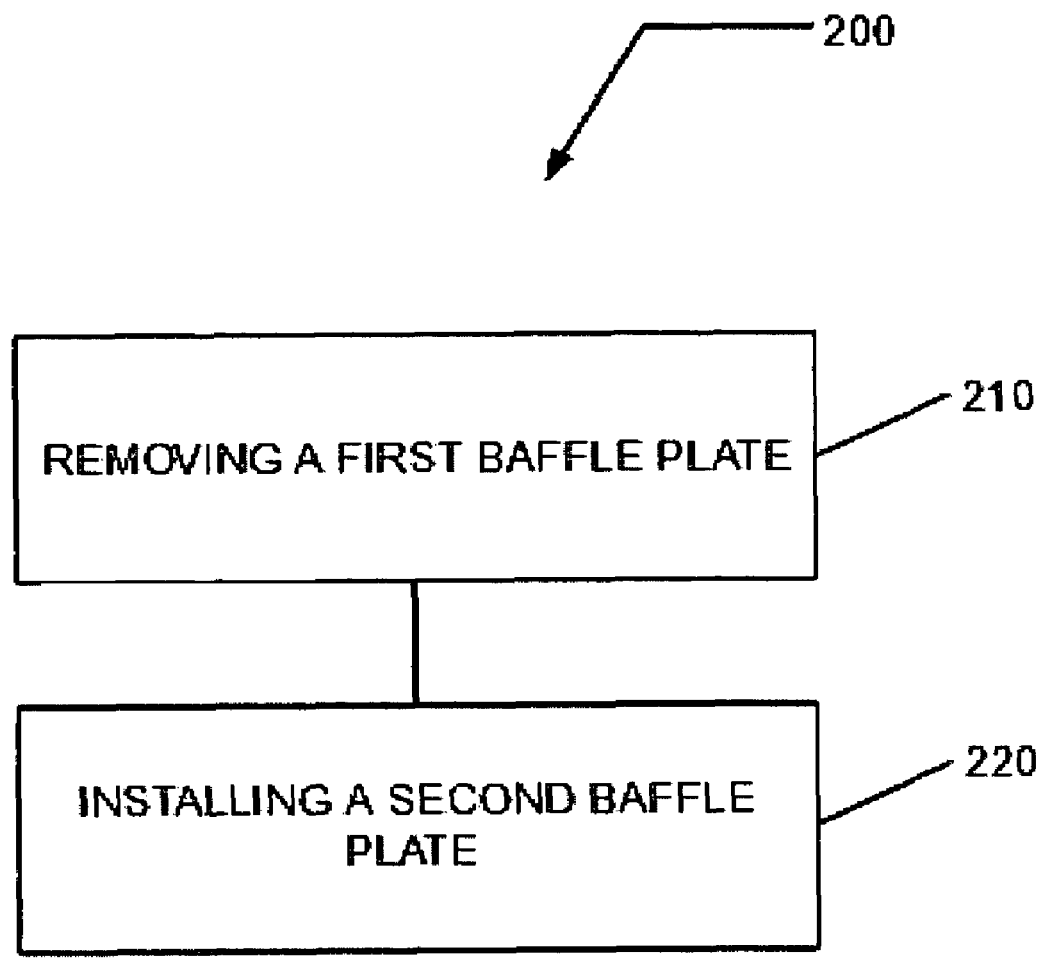
FIG. 14 presents a method of replacing a baffle plate surrounding a substrate holder in a plasma processing system.

Referring now to FIG. 14, a method for replacing a baffle plate surrounding a substrate holder in a plasma processing system is described. The method comprises a flow chart 200 beginning in 210 with removing a first baffle plate from the plasma processing system. Removing the first baffle plate can, for example, comprise venting the plasma processing system to atmospheric conditions and opening the plasma processing chamber to access the interior, followed by decoupling the baffle plate from the substrate holder. Decoupling the baffle plate from the substrate holder can, for example, comprise lifting the baffle plate away from the substrate holder, or removing fasteners utilized to fasten the baffle plate to the substrate holder and then lifting the baffle plate away from the substrate holder.

In 220, a second baffle plate is installed in the plasma processing system by coupling the second baffle plate to the substrate holder, wherein the coupling facilitates auto-centering of the second baffle plate in the plasma processing system. The second baffle plate can comprise the first baffle plate following refurbishing, or it can be a newly fabricated baffle plate. Auto-centering of the second baffle plate in the plasma processing system can be achieved, as described above, by providing a mating surface on an inner radial edge of the baffle plate, and coupling the mating surface to a centering surface on a lip region of a centering ring mounted on the substrate holder. Alternately, auto-centering of the second baffle plate in the plasma processing system can be achieved by providing two or more pins mounted on a contact surface on the baffle plate, and coupling the pins on the baffle plate to two or more receiving holes on a receiving surface of the centering ring.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A baffle plate assembly for surrounding a substrate holder in a plasma processing system comprising:
    a centering ring configured to be coupled to said substrate holder, wherein at least a portion of said centering ring extends radially outside a periphery of said substrate holder; and
    a removable baffle plate comprising one or more passageways, wherein said baffle plate is configured to be centered within said plasma processing system by removably coupling said baffle plate to said portion of said centering ring extending radially outside said periphery of said substrate holder, and
    wherein said centering ring comprises a centering feature configured to center said baffle plate on said centering ring.

2. The baffle plate assembly of claim 1, wherein said centering feature comprises at least one of a centering pin, a centering receptacle, a centering edge, and radial face gear teeth.

3. The baffle plate assembly of claim 1, wherein said baffle plate comprises a mating feature configured to be coupled with said centering feature.

4. The baffle plate assembly of claim 3, wherein said mating feature comprises at least one of a centering pin, a centering receptacle, a centering edge, and radial face gear teeth.

5. A baffle plate assembly for surrounding a substrate holder in a plasma processing system comprising:
    a centering ring configured to be coupled to said substrate holder, wherein at least a portion of said centering ring extends radially outside a periphery of said substrate holder; and
    a removable baffle plate comprising one or more passageways, wherein said baffle plate is configured to be centered within said plasma processing system by removably coupling said baffle plate to said portion of said centering ring extending radially outside said periphery of said substrate holder, and
    wherein said centering ring is made from aluminum.

6. A baffle plate assembly for surrounding a substrate holder in a plasma processing system comprising:
    a centering ring configured to be coupled to said substrate holder, wherein at least a portion of said centering ring extends radially outside a periphery of said substrate holder; and
    a removable baffle plate comprising one or more passageways, wherein said baffle plate is configured to be centered within said plasma processing system by removably coupling said baffle plate to said portion of said centering ring extending radially outside said periphery of said substrate holder, and
    wherein a surface of said baffle plate comprises a protective barrier.

7. A baffle plate assembly for surrounding a substrate holder in a plasma processing system comprising:
    a centering ring configured to be coupled to said substrate holder, wherein at least a portion of said centering ring extends radially outside a periphery of said substrate holder; and
    a removable baffle plate comprising one or more passageways, wherein said baffle plate is configured to be centered within said plasma processing system by removably coupling said baffle plate to said portion of said centering ring extending radially outside said periphery of said substrate holder, and
    wherein a portion of a surface of said baffle plate comprises a protective barrier.

8. The baffle plate assembly of claim 6 or 7, wherein said protective barrier comprises at least one of surface anodization, a coating formed using plasma electrolytic oxidation, and a spray coating.

9. The baffle plate assembly of claim 6 or 7, wherein said protective barrier comprises a layer of at least one of a III-column element and a Lanthanon element.

10. The baffle plate assembly of claim 6 or 7, wherein said protective barrier comprises at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$.

11. A method of replacing a baffle plate disposed adjacent a centering ring with at least a portion of said centering ring extending radially outside a periphery of a substrate holder, said baffle plate surrounding said substrate holder in a plasma processing system, the method comprising:
    removing said first baffle plate from said centering ring in said plasma processing system, and
    installing a second baffle plate in said plasma processing system by coupling said second baffle plate to said centering ring, wherein said coupling facilitates autocentering of said second baffle plate in said plasma processing system.

* * * * *